United States Patent [19]
Cho

[11] Patent Number: 5,844,429
[45] Date of Patent: Dec. 1, 1998

[54] BURN-IN SENSING CIRCUIT

[75] Inventor: Sung Ho Cho, Kyungki-Do, Rep. of Korea

[73] Assignee: LG Semicon Co., Ltd., Cheongju, Rep. of Korea

[21] Appl. No.: 683,632

[22] Filed: Jul. 15, 1996

[30] Foreign Application Priority Data

Feb. 1, 1996 [KR] Rep. of Korea ............... 1996 2457

[51] Int. Cl.[6] .................................................. H03K 3/037
[52] U.S. Cl. ........................... 327/68; 327/74; 327/143; 327/206
[58] Field of Search ........................ 327/77, 80, 81, 327/170, 134, 108, 111, 112, 379, 380, 381, 383, 384, 534, 537, 74, 143, 198, 73, 72, 68, 205, 206; 326/27

[56] References Cited

U.S. PATENT DOCUMENTS

| | | | |
|---|---|---|---|
| 4,506,168 | 3/1985 | Uya | 327/206 |
| 4,539,489 | 9/1985 | Vaughn | 327/206 |
| 4,970,408 | 11/1990 | Hanke et al. | 327/143 |
| 5,075,572 | 12/1991 | Poteet et al. | 327/537 |
| 5,192,879 | 3/1993 | Aoki et al. | 326/27 |
| 5,459,437 | 10/1995 | Campbell | 327/206 |
| 5,467,256 | 11/1995 | Choi | 371/21.1 |
| 5,475,333 | 12/1995 | Kumagai | 327/537 |
| 5,491,429 | 2/1996 | Gasparik | 326/27 |
| 5,497,348 | 3/1996 | Tsay | 365/201 |
| 5,644,266 | 7/1997 | Chen et al. | 326/27 |

*Primary Examiner*—Toan Tran
*Attorney, Agent, or Firm*—Fleshner & Kim

[57] ABSTRACT

An improved burn-in sensing circuit for a semiconductor device generates a signal for indicating a start of a burn-in mode when an external voltage exceeds a predetermined level of a logic threshold voltage. The circuit obtains a desired hysteresis characteristic between a burn-in entry voltage and a burn-in exit voltage by lowering a level of the logic threshold voltage, and includes an external voltage sensor for dropping and outputting an external voltage in accordance with a bias voltage applied thereto. A burn-in signal generator of the circuit generates a predetermined level of a burn-in signal, and feeds back the predetermined level of a burn-in signal to lower the logic threshold voltage when a predetermined level of dropped voltage is higher than its logic threshold voltage.

17 Claims, 2 Drawing Sheets

BURN-IN SENSING CIRCUIT

TECHNICAL FIELD

The present invention relates to a sensing circuit, and in particular, to a burn-in sensing circuit for detecting a normal operation or a burn-in operation of a semiconductor device.

BACKGROUND ART

Conventionally, a voltage higher than in a normal operation is applied during a burn-in test of a semiconductor chip to examine for defect at earlier time within a short time. An internal power generator is provided in the semiconductor chip, and an internal chip element is directed being operate in accordance with a lower voltage than an externally applied voltage in a normal operation region to prevent a decline of the semiconductor element reliability and to consume low power. The internal power generator generates a regular voltage regardless of the external voltage changes during the normal operation region to ensure reliability and stability.

When an external voltage level is higher than in a normal operation region, the internal power generator recognizes the higher voltage level of a burn-in region. The internal power generator generates a voltage proportional to a higher external voltage level, and applies the voltage to each element of the chip. A burn-in sensing circuit detects whether the level of an external voltage applied to a chip is in a normal operation region or in a burn-in region to perform the above-mentioned operation.

FIG. 1 illustrates a conventional burn-in sensing circuit comprising a bias voltage generator 10, an external voltage sensor 20, a burn-in signal generator 40 and a fuse selector 60. The bias voltage generator 10 generates a bias voltage Vbias in accordance with an external voltage Vbbokb applied thereto. An external voltage sensor 20 drops an external voltage Vdd to a predetermined level in accordance with the bias voltage Vdd applied thereto and obtains an hysteresis characteristic for the level of the dropped voltage. The burn-in signal generator 40 outputs a burn-in signal when the voltage level outputted from the external voltage sensor 20 is higher than a predetermined level and controls the hysteresis characteristic. A fuse selector 60 adjusts an external voltage of the external voltage sensor 20 in accordance with an external voltage Vbbokb applied thereto.

The external voltage sensor 20 includes a plurality of NMOS transistors 21–28 in a diode configuration with the gates mutually connected to the drains. The NMOS transistors 21–28 drop the voltage applied to their respective gate-drain connection points to a predetermined threshold voltage. An NMOS transistor 29 has a drain connected to the source of the NMOS transistor 28, a source connected to ground, and a gate connected to the bias voltage Vbias, and functions as an electric current source. A MOS capacitor 30 has source and drain connected to ground, and the gate is connected to the bias voltage Vbias, for removing the noise applied to the gate of the NMOS transistor 29. An NMOS transistor 31 has a drain connected to the source-drain connection point of the NMOS transistors 28 and 29, a source connected to ground, and a gate connected to the bias voltage Vbias. PMOS transistors 32 and 33 have the sources and the drains connected, respectively, to the drains and the sources of the NMOS transistor, for adjusting the level of a voltage drop by bypassing the NMOS transistors 22 and 23 in accordance with an output signal of the fuse selector 60 applied thereto. PMOS transistor 34 includes source connected to the source-drain connection point of the NMOS transistors 26 and 27, the drain connected to the drain-source connection point of the NMOS transistors 28 and 29, and a gate connected to an output signal BIB of the burn-in signal generator 40, so that an output signal of the external signal sensor 20 has an hysteresis characteristic. The NMOS transistors 21 through 28 have a low threshold voltage.

The burn-in signal generator 40 includes PMOS transistors 41 and 42 and NMOS transistor 43 connected in series between an external voltage and ground. The gates receive an output signal of the external voltage sensor 20 through a node A. A MOS capacitor 44 has a gate commonly connected to the gates of the MOS transistors 41 through 43, and the drain and the source connected to ground, respectively, for removing noise generated by the output signal of the external voltage sensor 20. An inverter 45 inverts at a node B a signal outputted from the drain connection point of the NMOS transistor 42 and 43.

MOS transistors 46 through 48 are connected in series between the external voltage and ground, the gates of transistors 46 and 47 receive an output signal of the inverter 45, and the gate of the NMOS transistor 48 receives a bias voltage Vbias. Inverters 49 through 51 sequentially invert the signals outputted from the drain connection point of the MOS transistors 46 and 47 at a node C. MOS capacitors 52 through 54 include the gates connected to a node C, and the drains and sources connected to ground.

When an external voltage Vbbokb is applied to a bias voltage generator 10, the bias voltage generator 10 generates a bias voltage Vbias to turn on NMOS transistors 29 and 48. With the transistor 29 turned on, an external voltage Vdd is applied to the gate-drain connection point of an NMOS transistor 21 which is subsequently lowered by NMOS transistors 21 through 28 connected in series and outputted to the node A.

The NMOS transistors 21 through 28 drop the voltage applied to the respective gates and drains to as much as the value of their own threshold voltage. In normal operation, the level of the adjusted voltage outputted through a node A is lower than the threshold voltage level of the NMOS transistor 43 of the burn-in signal generator 40. When the voltage at the node A is lower than the threshold voltage of the NMOS transistor 43, the NMOS transistor 43 is turned off, the PMOS transistors 41–42 are turned on, and a node B receives a high level signal. The high level signal is inverted into a low level, and is applied to the gates of MOS transistors 46 and 47.

Since a low level signal is applied to the gate of the MOS transistors 46 and 47, and the bias voltage Vbias is applied to the gate of the NMOS transistor 48 connected to the MOS transistor 47, a high level signal is outputted to the node C. As the high level signal is inverted successively by inverters 49 through 51, a burn-in signal BI of a low level signal is outputted, indicating that a chip is in a normal operation region.

As the external voltage Vdd of the external voltage sensor 20 is gradually increased, the electric potential of the node A is correspondingly increased. Since the electric potential of the node A has a higher level than the threshold voltage of the NMOS transistor 43, the NMOS transistor 43 is turned on, but the PMOS transistors 41 and 42 are turned off. A low level signal is outputted to the node B which is inverted into a high level signal by the inverter 45, and then is applied to the gates of the MOS transistors 46 and 47. Hence, since the PMOS transistors 46 and 47 are turned off and on, respectively, and a low level signal is outputted to the node C. The low level signal is successively inverted by the inverters 49 through 51, and a burn-in signal BI becomes high level, indicating that the level of the external voltage BI has entered a burn-in mode.

In a burn-in mode, the burn-in signal generator 40 outputs a high level burn-in signal BI, and an inverted low level burn-in signal BIB. The inverted low level burn-in signal BIB turns on the PMOS transistor 34 of the external voltage sensor 20. Since the turned-on PMOS transistor 34 forms a route for bypassing the NMOS transistors 27–28, the external voltage Vdd is not dropped by the NMOS transistors 27–28. When compared with the level before the formation of the bypass route in the burn-in mode operation, the voltage at the node A in a burn-in mode is increased by as much as the sum of the threshold voltage of the NMOS transistors 27 and 28 e.g., 2(Vth), where Vth is a threshold voltage of the NMOS transistors 27 and 28. The voltage level of the external voltage Vdd then decreases to the burn-in exit voltage, which is approximately the burn-in entry voltage less the voltage 2Vth, so that a chip in a burn-in mode can exit the burn-in mode. In other words, the burn-in signal BI transistions to a low level.

There should be an hysteresis characteristic where a width of 2Vth exists between the burn-in entry voltage and the burn-in exit voltage, as shown in FIG. 2. When the hysteresis characteristic is present, there is no change in the level of the burn-in signal BI, and the voltage of the node A does not go below 2Vth. Compared with the burn-in entry voltage, the voltage of the node A decreases slightly. Hence, although the voltage level of the node A is unstable, an oscillating phenomenon where the burn-in mode entry and the burn-in mode exit are repeated can be prevented.

In accordance with an external voltage Vbbokb applied to the fuse selector 60, the fuse selector 60 outputs a predetermined signal to the gates of the PMOS transistors 32 and 33. When the fuse selector 60 outputs a low level voltage to the PMOS transistor 32, the transistor 32 turns on, and bypasses the route through the NMOS transistor 22. Hence, the voltage dropped from the external voltage sensor 20 becomes low, compared with no bypass route formed by the MOS transistor 32. The fuse selector 60 externally adjusts a width of the voltage dropped by the external voltage sensor 20.

Meanwhile, the NMOS transistor 11 controls a burn-in sensing operation. When the voltage Vbbokb applied to the gate of the NMOS transistor 11 is low, the transistor 11 is turned off and this low level voltage has no effect on the burn-in sensing operation. When the voltage applied to the gate of the NMOS transistor is high level, the transistor 11 is turned on and the electric potential at the node A is dropped to ground level. Hence, the burn-in sensing operation is not performed. The MOS capacitor 44 removes the noise generated from the voltage of the node A, and MOS capacitors 52–54 remove an alternating-current noise mixed with the signal of the node C.

In a conventional burn-in sensing circuit for a semiconductor memory device, whether the operation of a chip enters a burn-in mode or exits the burn-in mode is determined entirely by the voltage at the node A. The voltage of the node A is controlled by the number of the transistors 21 through 28 for dropping a voltage to a predetermined level. However, since these transistors 21 through 28 are very sensitive to changes of the manufacturing process, it is difficult to adjust the voltage at the node A. Further, there is another problem that a transistor having a low threshold voltage should be used as the transistors 21 through 28 for dropping the voltage.

DISCLOSURE OF THE INVENTION

The present invention is achieved in part by a burn-in sensing circuit for a semiconductor which includes an external voltage sensor for dropping and outputting an external voltage in accordance with a bias voltage applied thereto; and burn-in signal generator for generating a predetermined level of a burn-in signal, feedbacking the predetermined level of a burn-in signal, and lowering the logic threshold voltage when a predetermined level of dropped voltage is higher than its logic threshold voltage.

The present invention may also be achieved in part by a circuit for detecting one of a normal and burn-in operations of a semiconductor device, comprising: a) a sensor receiving a first signal of first and second levels and outputting to a first node a first prescribed potential when the sensor detects the first signal and a second prescribed potential when the sensor detects the second signal; and b) a signal generator coupled to the first node, the signal generator including i) an inverter circuit coupled to the first node and outputting to a second node a first output signal indicative of a normal operation when receiving the first prescribe signal and a second output signal indicative of the burn-in operation when receiving the second prescribed signal, and ii) means for adjusting a threshold potential level of the inverter circuit coupled to the second node.

The present invention may be achieved in part by a device for increasing a potential difference between a burn-in entry and exit voltages when a signal indicates a burn-in operation of semiconductor device, comprising: first and second transistors coupled in series, both gates commonly coupled to a first node receiving the signal, and electrodes commonly connected to a second node; and means for adjusting a threshold potential level of one of the first and second transistors.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
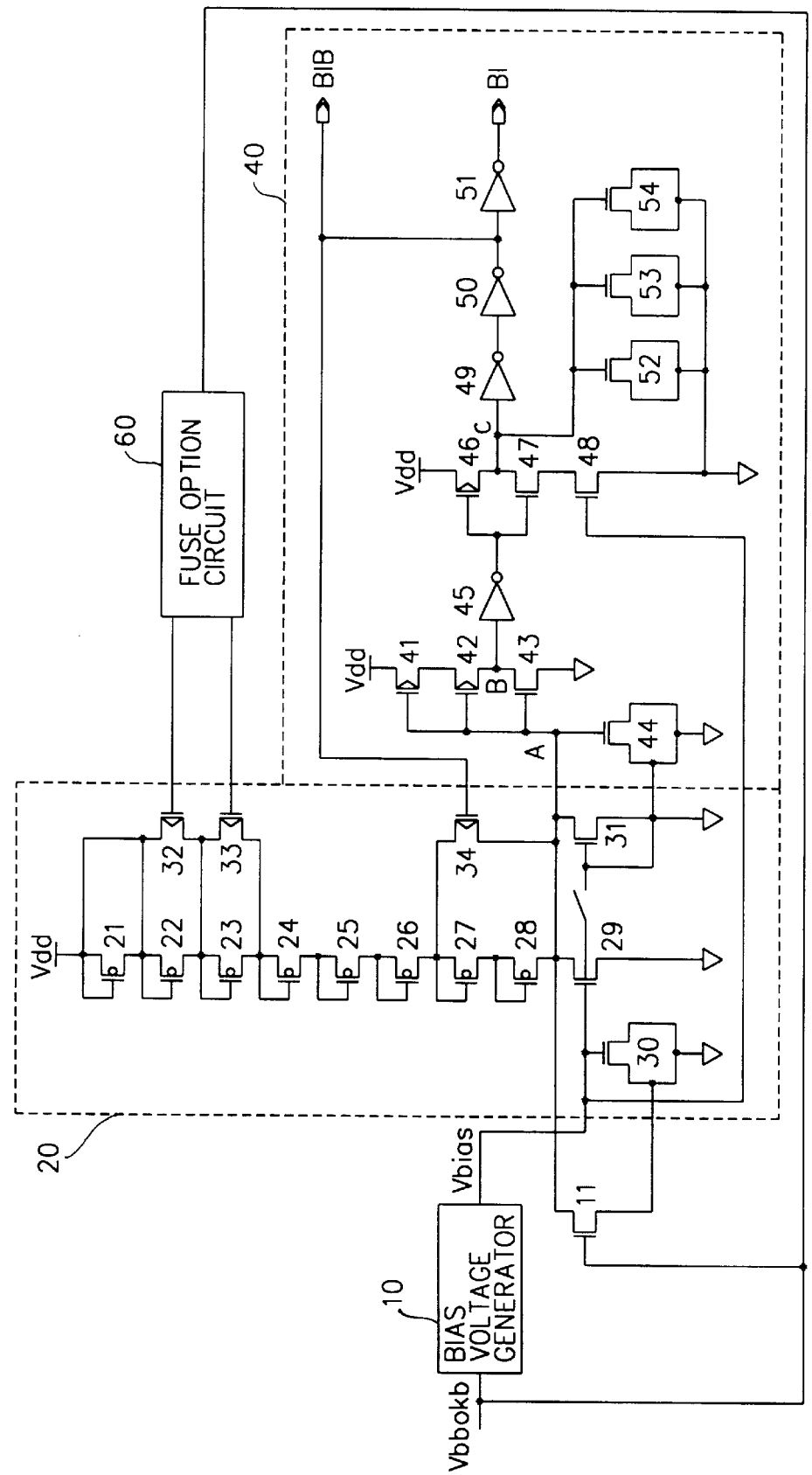
FIG. 1 is a diagram of a conventional burn-in sensing circuit.
Figure 3:
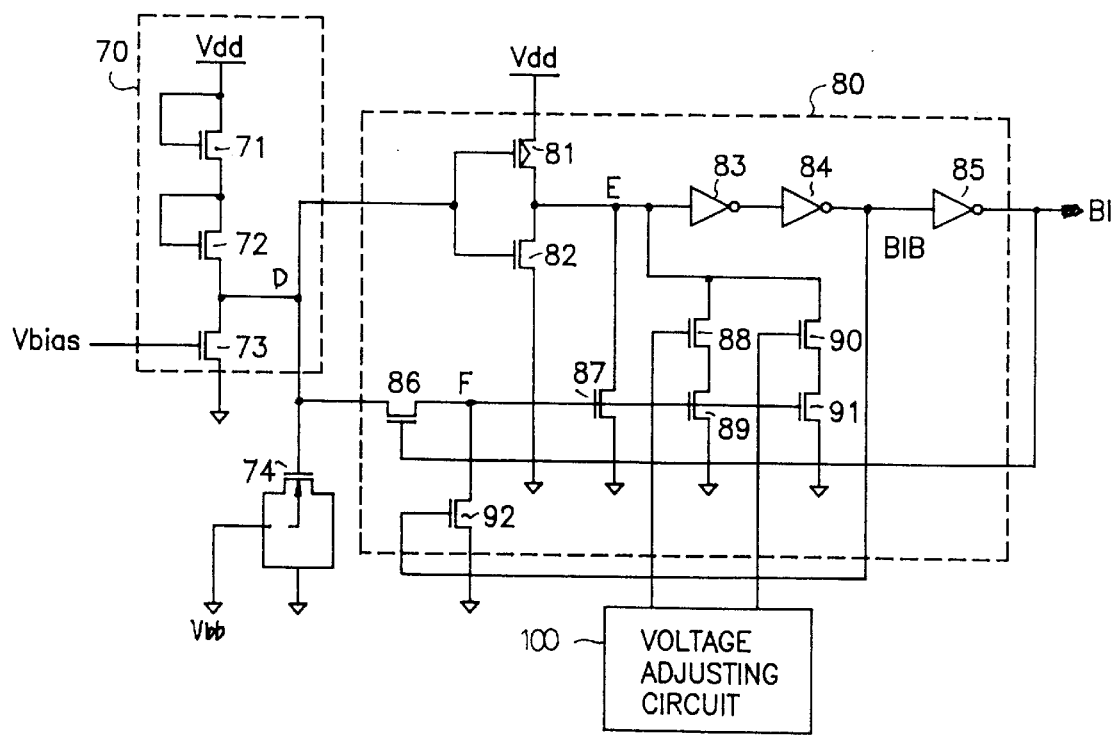
FIG. 3 is a diagram of a burn-in sensing circuit in accordance with the present invention.

FIG. 3 shows a burn-in sensing circuit for a semiconductor memory device according to the present invention. An external voltage sensor 70 drops an external voltage Vdd in accordance with a bias voltage applied thereto, and a burn-in signal generator 80 generates a burn-in signal BI having a predetermined level and obtaining an hysteresis characteristic between a burn-in mode entry voltage and a burn-in mode exit voltage. A voltage adjusting unit 100 adjusts a voltage width between a burn-in entry voltage and a burn-in exit voltage. In FIG. 3, a bias voltage generator 10, and a fuse selector 60 as shown in FIG. 1 are not illustrated, and are excepted in the following description since the construction and operation thereof are the same as those of the FIG. 1.

In the external voltage sensor 70, NMOS transistors 71 and 72 with commonly connected gate and drain and an NMOS transistor 73 with a gate receiving a bias voltage Vbias are connected in series between an external voltage Vdd and ground. An output signal is outputted from the source-drain connection point of the NMOS transistors 72 and 73 at the node D. A MOS capacitor 74 is used to remove a coupling noise generated at the node D.

The burn-in signal generator 80 includes a PMOS transistor 81 and an NMOS transistor 82 connected in series between an external voltage Vdd and ground, and the gates receive an output signal of the external voltage sensor 70. Inverters 83 through 85 invert an output signal outputted through a node E, and an NMOS transistor 86 transmits to the other side a signal at the node D applied to one side in accordance with an output signal BI of the inverter 85 applied to the gate thereof. An NMOS transistor 87 has a drain connected to the node E and has a source grounded to lower a logic threshold voltage of the MOS transistors 81 and 82 in accordance with a signal inputted from the NMOS transistor 86 and applied to the gates of the MOS transistors 81 and 82 through a node F.

NMOS transistors 88 and 89 are connected in series between the node E and ground, and the gates of transistors 88 and 89, respectively, receive output signal from the voltage adjusting unit 100 and a signal from the node F. NMOS transistors 90 and 91 have the same configuration as the NMOS transistors 88 and 89. An NMOS transistor 92, has a drain connected to the node F, a source connected to ground, and the gate receives an output signal of the inverter 84.

When a bias voltage Vbias is applied to the gate of an NMOS transistor 73 of the external voltage sensor 70, the transistors 71 and 72 lower an external voltage Vdd applied to the gate-drain connection point of an NMOS transistor 71. The dropped or lowered voltage is respectively applied to the gates of the MOS transistors 81 and 82. Since the lowered voltage is lower than a logic threshold voltage of the NMOS transistor 82 in a normal operation, the NMOS transistor 82 is turned off, the PMOS transistor 81 is turned on, and the potential at the node E becomes a high level. The high level signal is inverted by the inverters 83 through 85, and a low level burn-in signal BI is finally outputted, which indicates that a chip is in a normal operation.

An NMOS transistor 86, which works as a first switch, is turned off, and an NMOS transistor 92, which works as a second switch, is turned on. Hence, an electric potential of the node F drops to a ground level, and there is no change in a logic threshold voltage of the NMOS transistors 81 and 82. The transistors 81 and 82 work as a logic inverter in accordance with NMOS transistors 87, 89, and 91, which are all turned off.

When an external voltage Vdd of the external voltage sensor 70 increases, a voltage at the node D correspondingly increases. The increased voltage of the node D is applied respectively to the gates of the MOS transistors 81 and 82. When the increased voltage level of the node D becomes higher than the logic threshold voltage level of the NMOS transistor 82, the NMOS transistor 82 is turned on and the PMOS transistor 81 is turned off to change the voltage of the node E to a low level. The low level voltage is inverted by the inverters 83 through 85, and a high level burn-in signal BI is outputted to indicate a burn-in mode of a chip. Thus, when an external voltage increases and the chip enters a burn-in mode, the burn-in signal generator 80 of the burn-in sensing circuit senses the entry of a burn-in mode. The burn-in signal generator 80 generates a high-level burn-in signal BI, which results in the performance of a burn-in operation in a semiconductor memory device.

The high level burn-in signal BI and the low level burn-in signal BIB, respectively, act to turn on and turn off the NMOS transistors 86 through 92, and transistors 86 and 92, respectively, work as a first switch and a second switch. The turned-on NMOS transistor 86 transmits a predetermined voltage corresponding to the voltage at the node D to the node F. Therefore, the NMOS transistor 87, which reduces a logic threshold voltage, is turned on. In accordance with the NMOS transistors 82 and 87 turning-on, two parallel routes are formed between the node E and ground.

Figure 2:
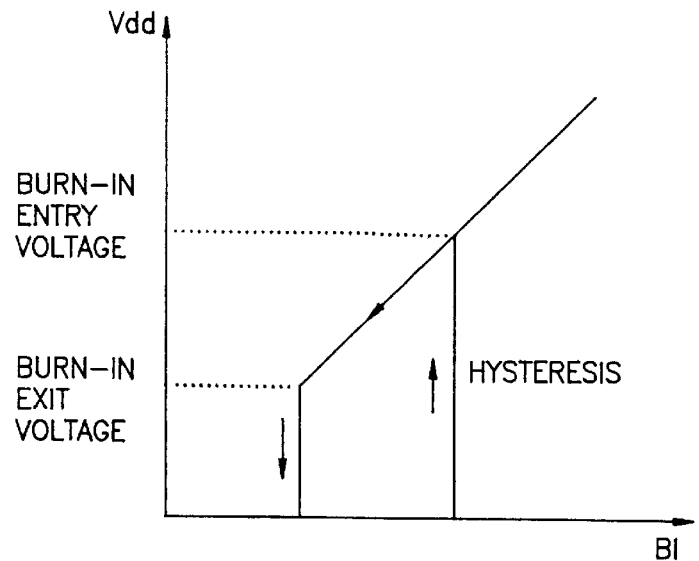
FIG. 2 is a graph of an hysteresis characteristic between a burn-in entry voltage and a burn-in exit voltage.

A logic threshold voltage level of a logic inverter becomes lower when the NMOS transistor 87 is included in the circuit compared to having only the transistors 81 and 82. In other words, a burn-in mode entry is performed in accordance with a turning-on operation of the NMOS transistor 82. However, once a voltage level enters a burn-in mode, the NMOS transistor 87 is turned on. Since the exit from a burn-in mode occurs at a lower voltage than a burn-in entry voltage, a desired hysteresis characteristic is obtained between a burn-in entry voltage and a burn-in exit voltage, as shown in FIG. 2. In other words, exit from burn-in mode occurs when the external voltage Vdd applied to the external voltage sensor drops below the burn-in entry voltage by more than the voltage amount of the hysteresis characteristics (e.g., at least the effect of the NMOS transistor 87.)

A desired hysteresis characteristic can be obtained by operating the NMOS transistors 88 through 91 in accordance with a control of the voltage adjusting unit 100. If the NMOS transistors 89 and 91 are turned on in accordance with the turned-on NMOS transistor 86, and the voltage adjusting unit 100 turns on the NMOS transistor 88, the NMOS transistors 88 and 89 form another parallel route including the NMOS transistor 87. Since the parallel route system greatly lowers the logic threshold voltage, a potential level difference between a burn-in entry voltage and a burn-in exit voltage is increased. NMOS transistors 90 and 91 also form another parallel route in accordance with a control of the voltage adjusting unit 100. The MOS transistors 88 through 91 work as a logic threshold voltage adjusting unit for respectively reducing a logic threshold voltage of the logic inverter. Thus, when a predetermined level difference between a burn-in entry voltage and a burn-in exit voltage is increased, the entered burn-in mode is not easily exited even though an external voltage Vdd is unstable.

As described above, in a burn-in sensing circuit for a semiconductor memory device according to the present invention, a burn-in entry voltage and a burn-in exit voltage become very insensitive to changes of process when an hysteresis characteristic between a burn-in entry voltage and a burn-in exit voltage is obtained by adjusting a logic thresh voltage of a burn-in signal generator. Further, it is not necessary to use a low-level threshold voltage transistor for dropping an external voltage in the present invention.

Although the preferred embodiments of the present invention have been disclosed for illustrative purposes, those skilled in the art will appreciate that various modifications, additions and substitutions are possible, without departing from the scope and spirit of the invention as described in the accompanying claims.

I claim:

1. A circuit for detecting one of a normal and burn-in operations of a semiconductor device, comprising:
   a) a sensor receiving a first signal of first and second levels and outputting to a first node a first prescribed potential when said sensor detects the first level and a second prescribed potential when said sensor detects the second level; and
   b) a signal generator coupled to said first node, said signal generator including
      i) an inverter circuit coupled to said first node and outputting to a second node a first output signal indicative of a normal operation when receiving the first prescribed potential and a second output signal indicative of the burn-in operation when receiving the second prescribed potential, and
      ii) a circuitry that adjusts a logic threshold potential level of said inverter circuit at said second node, wherein said circuitry comprises,
         a first transistor coupled to said second node,
         a first switch coupled to said first transistor at a third node and said first node, and
         a second switch coupled to said third node and receiving one of the first and second output signals.

2. The circuit of claim 1, wherein said sensor comprises a pair of serially connected transistors in a diode configuration, one of said pair of transistors receiving the first signal and another coupled to said first node, and a first transistor having a gate receiving a second signal, a drain coupled to said first node, and a source coupled to a ground potential.

3. The circuit of claim 1, wherein said inverter circuit comprises first and second transistors coupled in series, both gates commonly coupled to said first node, and electrodes commonly connected to said second node.

4. The circuit of claim 1, wherein said first switch receives an inverted signal of one of the first and second output signals.

5. The circuit of claim 1, wherein said circuitry further comprises means for increasing a potential difference between burn-in entry and exit voltages when the second output signal is present at the second node.

6. The circuit of claim 5, said potential increasing means comprises:
   a first serially connected pair of transistors coupled to said second node, and
   a second serially connected pair of transistors coupled to said second node.

7. The circuit of claim 6, wherein said potential increasing means further comprises means for controlling operations for said first and second serially connected pair of transistors.

8. A device for increasing a potential difference between a burn-in entry and exit voltages when a signal indicates a burn-in operation of semiconductor device, comprising:
   first and second transistors coupled in series, both gates commonly coupled to a first node receiving the signal, and electrodes commonly connected to a second node; and
   a circuitry that adjusts a logic threshold potential level at the second node, wherein said circuitry comprises,
      a first serially coupled pair of transistors coupled between said second node and a third node,
      a second serially coupled pair of transistors coupled between the second node and the third node, and
      a third transistor to coupled to said second node, wherein the circuitry increases a potential difference between a burn-in entry and exit voltages when a signal indicating the burn-in operation is present at the second node.

9. The device of claim 8, wherein said circuitry further comprises a first switch coupled to said third transistor at a fourth node and said first node.

10. The device of claim 8, wherein said circuitry further comprises a switch coupled to the third transistor at a fourth node.

11. The device of claim 8, wherein said circuitry further comprises a controller that controls said first and second serially connected pair of transistors.

12. The device of claim 8, wherein said third node receives a prescribed voltage.

13. The device of claim 10, wherein said switch is coupled between said fourth node and said third node, and wherein said circuitry further comprises means for controlling operations of said switch.

14. A circuit for detecting one of a normal and burn-in operations of a semiconductor device, comprising:
   a) a sensor receiving a first signal of first and second levels and outputting to a first node a first prescribed potential when said sensor detects the first level and a second prescribed potential when said sensor detects the second level, wherein said sensor comprises a pair of serially connected transistors in a diode configuration, one of said pair of transistors receiving the first signal and another coupled to said first node, and a bias transistor having a gate receiving a second signal, a drain coupled to said first node, and a source coupled to a second potential; and
   b) a signal generator coupled to said first node, said signal generator including
      i) an inverter circuit coupled to said first node and outputting to a second node a first output signal indicative of a normal operation when receiving the first prescribed potential and a second output signal indicative of the burn-in operation when receiving the second prescribed potential, and
      ii) a circuitry that adjusts a logic threshold potential level of said inverter circuit at said second node, wherein said circuitry comprises a first transistor coupled to said second node and a first switch coupled to said first transistor at a third node and said first node.

15. The circuit of claim 14, wherein said circuitry further comprises:
   a first serially connected pair of transistors coupled to said second node; and
   a second serially connected pair of transistors coupled to said second node, wherein said first switch receives an inverted signal of one of the first and second output signals.

16. The circuit of claim 14, wherein said circuitry further comprises a second switch coupled to the third node.

17. The circuit 16, wherein said circuitry further comprises a controller for the second switch.

* * * * *